(12) United States Patent
Sugawara et al.

(10) Patent No.: US 8,748,937 B2
(45) Date of Patent: Jun. 10, 2014

(54) INSULATED GATE BIPOLAR TRANSISTOR WITH HIGH BREAKDOWN VOLTAGE

(71) Applicant: Fuji Electric Co., Ltd., Kawasaki (JP)

(72) Inventors: Yoshitaka Sugawara, Hitachi (JP); Nobuyuki Takahashi, Tokyo (JP)

(73) Assignees: Fuji Electric Co., Ltd., Kawasaki-shi (JP); Yoshitaka Sugawara, Hitachi-shi (JP)

( * ) Notice: Subject to any disclaimer, the term of this patent is extended or adjusted under 35 U.S.C. 154(b) by 0 days.

(21) Appl. No.: 13/651,973

(22) Filed: Oct. 15, 2012

(65) Prior Publication Data

US 2013/0092978 A1    Apr. 18, 2013

(30) Foreign Application Priority Data

Oct. 14, 2011    (JP) .................. 2011-227473

(51) Int. Cl.
*H01L 29/739*    (2006.01)

(52) U.S. Cl.
USPC ........... 257/139; 438/542; 438/269; 438/285; 438/268

(58) Field of Classification Search
USPC .................. 257/139, E29.197, 341, 355, 378
See application file for complete search history.

(56) References Cited

U.S. PATENT DOCUMENTS

| | | | |
|---|---|---|---|
| 5,751,024 A | 5/1998 | Takahashi | |
| 2002/0048915 A1 | 4/2002 | Reznik | |
| 2007/0235755 A1* | 10/2007 | Takei | 257/132 |
| 2009/0050932 A1* | 2/2009 | Lu et al. | 257/139 |
| 2009/0283797 A1 | 11/2009 | Takahashi et al. | |
| 2010/0140628 A1 | 6/2010 | Zhang | |

FOREIGN PATENT DOCUMENTS

| | | |
|---|---|---|
| EP | 0 837 508 A2 | 4/1998 |
| JP | 10-178174 A | 6/1998 |
| JP | 3288218 B2 | 6/2002 |
| JP | 2002-532885 A | 10/2002 |
| JP | 3395520 B2 | 4/2003 |
| JP | 2008-211178 A | 9/2008 |
| JP | 4688901 B2 | 5/2011 |

OTHER PUBLICATIONS

K. Oyama et al, "Advanced HiGT with Low-injection Punch-through (LiPT)structure", Proceedings of 2004 International Symposium on Power Semiconductor Devices & ICs, pp. 111-114.
W. Sung et al, "Design and investigation of frequency capability of 15kV 4H-SiC IGBT", International Symposium on Power Semiconductor Devices & ICs 2009, pp. 271-274.

* cited by examiner

*Primary Examiner* — Chuong A Luu
*Assistant Examiner* — Rodolfo Fortich
(74) *Attorney, Agent, or Firm* — Westerman, Hattori, Daniels & Adrian, LLP (57) ABSTRACT

A semiconductor device includes a semiconductor layer of a first conductor type; a first semiconductor layer of a second conductor type, on the front of the semiconductor layer; a second semiconductor layer of the second conductor type, on the first semiconductor layer and having a higher impurity concentration than the first semiconductor layer; a third semiconductor layer of the second conductor type, on the second semiconductor layer and having a lower impurity concentration than the second semiconductor layer; a first semiconductor region of the first conductor type, in a surface layer of the third semiconductor layer; a second semiconductor region of the second conductor type, in a surface layer of the first semiconductor region; an input electrode contacting the second semiconductor region; a control electrode disposed above part of the first semiconductor region with an insulating film therebetween; and an output electrode disposed on the back of the semiconductor layer.

11 Claims, 6 Drawing Sheets

INSULATED GATE BIPOLAR TRANSISTOR WITH HIGH BREAKDOWN VOLTAGE

BACKGROUND OF THE INVENTION

1. Field of the Invention

The embodiments discussed herein pertain to a semiconductor device.

2. Description of the Related Art

As an insulated gate bipolar transistor (IGBT) based on silicon semiconductor, an IGBT that increases collector-emitter current density $J_{ce}$ (current density between collector and emitter) and reduces internal loss by enhancing a conductivity modulation effect in a drift layer has been developed.

Examples of such an IGBT is a high conductivity IGBT (HiGT) or a carrier stored trench-gate bipolar transistor that improves the carrier storage effect in an n⁻ drift layer by inserting between a p-body region and the n⁻ drift layer an n semiconductor layer (hereinafter "current density enhancement layer" (CEL)) in which the impurity concentration is higher than in the n⁻ drift layer (see for example, see Japanese Patent Nos. 3288218, 4688901, 3395520, Japanese Laid-open Patent Publication No. 10-178174, and Oyama, K., et al, "Advanced HiGT with Low-injection Punch-through (LiPT) structure", Proceedings of 2004 International Symposium on Power Semiconductor Devices & ICs, May 2004, pp. 111-114).

Figure 6:
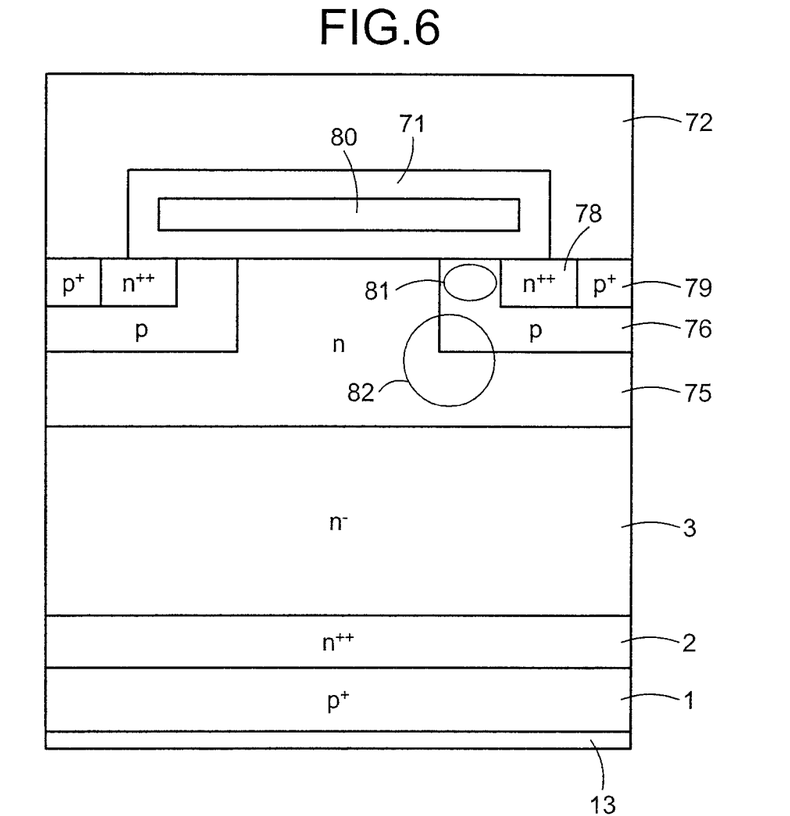
FIG. 6 is a sectional view of a conventional semiconductor device.

Recently, semiconductor materials (wide bandgap semiconductor materials) which have wider bandgaps than silicone such as silicone carbide (SiC) semiconductor are attracting attention. An IGBT with silicone carbide semiconductor (hereinafter "SiC-IGBT") demonstrates superior performance such as low ON-state resistance, operability under high temperature, and large electric field intensity for electrical breakdown in comparison with an IGBT with silicone semiconductor. It has been proposed that the CEL is added into the SiC-IGBT to increase the collector-emitter current density $J_{ce}$ (see Japanese Laid-open Patent Publication No. 2008-211178 and Woongje Sung, et al, "Design and investigation of frequency capability of 15 kV 4H—SiC IGBT", International Symposium on Power Semiconductor Devices & ICs 2009, July 2009, pp. 271-274). FIG. 6 is a sectional view of a semiconductor device for explaining a structure described in Japanese Laid-open Patent Publication No. 2008-211178 and Woongje Sung, et al, "Design and investigation of frequency capability of 15 kV 4H—SiC IGBT" as an example.

However, according to the above related art, the installment of the nCEL 75 of FIG. 6 can increase collector-emitter current density $J_{ce}$ but under the forward bias, a problem arises that breakdown voltage lowers because the intensity of the electric field near the pn junction of the p-body region 76 and the nCEL 75 increases. Especially, the electric field becomes strong at the corner (encircled portion) (hereinafter, the corner of the p-body region) below the p⁻ channel 81 (encircled portion toward the gate oxide film) of the p body region 76. This kind of problem dominantly manifests itself when the impurity concentration in the nCEL 75 is raised or when the carrier storage effect is enhanced by increasing the thickness of the nCEL 75. When the electric field gets strong at the corner 82, the breakdown voltage lowers.

For example, Woongje Sung, et al, discloses a 15 kV SiC-IGBT where the n⁻ drift layer 3 is chosen to be 150 μm thick and doped at $4.5 \times 10^{14}$ cm⁻³, the nCEL 75 is chosen to be 3 μm thick and doped at $8.0 \times 10^{15}$ cm⁻³, and the channel width (p⁻ channel region 81) is 0.7 μm.

The SiC-IGBT of Woongje Sung, et al, "Design and investigation of frequency capability of 15 kV 4H—SiC IGBT" shows a property that when the breakdown voltage is 15 kV, the collector-emitter voltage $V_{ce}$ is 7.24 V and the collector-emitter current density $J_{ce}$ is 30 A/cm², which is low. There is a trade-off relationship between the collector-emitter current density $J_{ce}$ and the breakdown voltage. Thus, it is difficult to improve both the collector-emitter current density $J_{ce}$ and the breakdown voltage.

The SiC-IGBT has a problem due to the characteristics of silicon carbide. Usually, the SiC-IGBT is formed on an epitaxial layer that is grown on a silicon carbide bulk substrate. In order to grow the epitaxial layer of 4H—SiC alone on the silicon carbide bulk substrate, an off-angle silicon carbide bulk substrate where the (0001) face (so-called "Si face") is slanted some degrees with respect to a crystal axis is used.

When the off-angle silicon carbide bulk substrate is used, part of basal plane dislocations are converted to edge dislocations but the remaining basal plane dislocations are propagated into the epitaxial layer during epitaxial growth. If the impurity concentration in the epitaxial layer that grows on the silicon carbide is high, the conversion of the basal plane dislocations into the edge dislocations becomes difficult and many basal plane dislocations tend to be propagated into the epitaxial layer.

Since the conventional SiC-IGBT above forms the nCEL 75 by epitaxial growth, most of the basal plane dislocations propagating from the silicon carbide bulk substrate to the n⁺⁺ buffer layer 2 and from the n⁺⁺ buffer layer 2 to the n⁻ drift layer 3 are propagated into the nCEL 75. The basal plane dislocations left in the epitaxial layer adversely affects a bipolar device such as an IGBT as below.

For example, in the conventional SiC bipolar device, a stacking fault occurs from a basal plane dislocation in the active region and is spread by collisions of the minority carrier injected in the active region under the forward biasing. As a result, as the SiC bipolar device stays active, the degradations in the forward direction such as the increase of the ON-resistance and the decrease of the current density occur. The SiC-IGBT, one type of the bipolar device, also suffers from the degradation in the forward direction such as the decrease of collector-emitter current density $J_{ce}$. As the impurity concentration in the nCEL becomes higher, more basal plane dislocations are propagated into the nCEL and remain and thus the degradation in the forward direction becomes larger.

Further, when an IGBT is switched from the OFF state to the ON state by applying the gate voltage under the forward biasing, holes (minority carrier) injected from the p⁺ collector layer 1 enter from the location in the nCEL 75 near the corner 82 of the p body region 76 to the p body region 76, and flows to the emitter electrode 72 across the p body region 76. When an IGBT is switched from the ON state to the OFF state by reducing the gate voltage under the forward biasing, holes (minority carrier) flowing in the portion in the nCEL 75 near the corner 82 of the p body region 76 disappear at the end of all.

Therefore, the conventional SiC-IGBT has a problem that the stacking fault in the nCEL 75 near the corner 82 of the p body region 76 becomes apparent since holes are concentrated near the corner 82 when the switch is turned on or off under the forward biasing. As a result, the forward direction characteristics in the nCEL 75 near the corner 82 degrade significantly.

Thus, even if the conventional SiC-IGBT increase the collector-emitter current density $J_{ce}$ with the nCEL 75, the stacking fault due to the basal plane dislocations left in the nCEL 75 increases the ON voltage and reduces the collector-emitter current density $J_{ce}$, thereby degrading the forward direction characteristics. As the degradation of the forward direction characteristics prevails, it becomes possible that the device is destroyed by large current that flows when the switch is turned on.

Metal atoms tend to gather in the stacking fault and the metal atom condensed stacking fault can be a path of leak current. When metal atoms gather at a stacking fault that is present across the junction between the p body region 76 and the nCEL 75, leak current flowing through the stacking fault reduces the breakdown voltage. A stacking fault present at the junction near the corner 82 of the p body region 76 where electric field most concentrates under the forward biasing significantly reduces the breakdown voltage, leading to the breakdown of a device in some cases. It is found for the first time that such a problem manifest itself as the operation frequency of an IGBT gets higher.

SUMMARY OF THE INVENTION

It is an object of the present invention to at least solve the above problems in the conventional technologies.

A semiconductor device according to one aspect of the invention includes a semiconductor layer of a first conductor type; a first semiconductor layer of a second conductor type, formed on the front side of the semiconductor layer; a second semiconductor layer of the second conductor type, formed on the first semiconductor layer and having a higher impurity concentration than the first semiconductor layer; a third semiconductor layer of the second conductor type, formed on the second semiconductor layer and having a lower impurity concentration than the second semiconductor layer; a first semiconductor region of the first conductor type, selectively formed in a surface layer of the third semiconductor layer; a second semiconductor region of the second conductor type, selectively formed in a surface layer of the first semiconductor region; an input electrode that contacts the second semiconductor region; a control electrode that is disposed above part of the first semiconductor region with an insulating film therebetween, the part being sandwiched by the second semiconductor region and the third semiconductor layer; and an output electrode that is disposed on the back side of the semiconductor layer.

The other objects, features, and advantages of the present invention are specifically set forth in or will become apparent from the following detailed description of the invention when read in conjunction with the accompanying drawings.

DETAILED DESCRIPTION OF THE PREFERRED EMBODIMENTS

Preferred embodiments of a semiconductor device will be explained with reference to the accompanying drawings. In the specification and the drawings, layers and regions with n or p added at the head indicate that the majority carrier is electrons or holes. A sign of + or − on the shoulder of n or p indicates layers or regions with that sign have a higher or lower impurity concentration than those without that sign. In the explanation below, identical elements are given identical reference numerals and the explanation thereof will be omitted.

Figure 1:
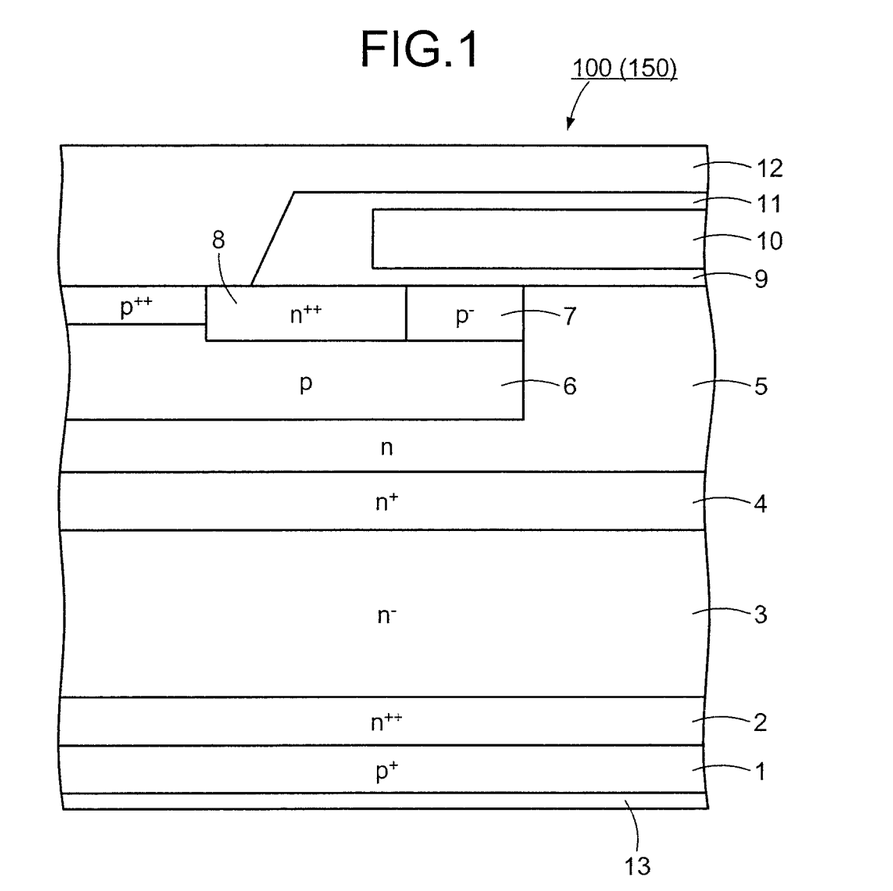
FIG. 1 is a cross sectional view of a semiconductor device according to the first embodiment.

FIG. 1 is a cross sectional view of a semiconductor device according to the first embodiment. The semiconductor device is an IGBT 100 made up of SiC semiconductor and having a 15 kV class breakdown voltage and a planar gate structure. FIG. 1 depicts only an active region of the IGBT 100. The IGBT 100 may include a voltage endurance mechanism (not shown) around the active region. The active region is a region where current flows when the semiconductor device is turned on. The voltage endurance mechanism mitigates the intensity of electric field at the pn junction and presents desired breakdown voltage.

As depicted in FIG. 1, on a p (first conductor type) semiconductor layer (hereinafter, a front side) which is a p$^+$ collector layer 1, an n$^{++}$ (second conductor type) buffer layer 2 is disposed. The n$^{++}$ buffer layer 2 is a SiC epitaxial layer. The p$^+$ collector layer 1 may have $1 \times 10^{19}$ cm$^{-3}$ of impurity concentration and 10 μm of thickness. The n$^{++}$ buffer layer 2 may have $1 \times 10^{18}$ cm$^{-3}$ of impurity concentration and 2 μm of thickness.

An n$^-$ drift layer (first semiconductor layer) 3 is disposed on the n$^{++}$ buffer layer 2. The n$^-$ drift layer 3 is a SiC epitaxial layer. The impurity concentration of the n$^-$ drift layer 3 is lower than that of the n$^{++}$ buffer layer 2. The n$^-$ drift layer 3 may have $2 \times 10^{14}$ cm$^{-3}$ of impurity concentration and 150 μm of thickness. At this level of impurity concentration, the 1 kV breakdown voltage per 10 μm thickness of the n$^-$ drift layer 3 can easily be realized. Thus, the 15 kV breakdown voltage can be expected by the 150 μm n$^-$ drift layer 3.

An n$^+$ semiconductor layer (current density enhancement layer: CEL, second semiconductor layer) 4 is disposed on the n$^-$ drift layer 3. Because two nCEL layers are used in the embodiments, the nCEL 4 is called nCELb (nCEL bottom) 4 indicating that the nCEL 4 is the lower nCEL of the two. The nCELb 4 is a SiC epitaxial layer with nitrogen (N) doped as impurity. The nCELb 4 may be a semiconductor layer with nitrogen ions injected. The nCELb 4 may be formed only in the active region. The nCELb 4 may be a semiconductor layer formed by ion implantation into the n$^-$ drift layer 3 of the active region.

The impurity concentration of the nCELb 4 is higher than that of the n$^-$ drift layer 3. The impurity concentration of the nCELb 4 is higher than an n conductor layer (CEL, hereinafter nCELu) 5 that is disposed on the nCELb 4. The nCELb 4 has such impurity concentration and thickness that the nCELb 4 is depleted by smaller voltage than the breakdown voltage of the IGBT 100. For example, the impurity concentration of the nCELb 4 may be at least $8 \times 10^{15}$ cm$^{-3}$ and at most $5 \times 10^{17}$ cm$^{-3}$ as long as the impurity concentration is higher than that of the n$^-$ drift layer 3 and that of the nCELu 5. The thickness of the nCELb 4 may be at least 0.3 μm and at most 5.6 μm.

An n semiconductor layer (CEL, third semiconductor layer) 5 is disposed on the nCELb 4. The nCEL 5 is hereinafter called nCELu (nCEL upper) 5 indicating that the nCEL 5 is the upper nCEL of the two. The nCELu 5 is a SiC epitaxial layer with nitrogen doped as impurity. It is preferable that the impurity concentration of the nCELu 5 is higher than that of the n$^-$ drift layer 3. The impurity concentration of the nCELu 5 is lower than that of the nCELb 4 and that of a p body region (p base region) 6. The nCELu 5 has such impurity concentration and thickness that the nCELu 5 is depleted under voltage smaller than the breakdown voltage of the IGBT 100.

The impurity concentration of the nCELu 5 may be at least $5\times10^{14}$ cm$^{-3}$ and at most $1\times10^{17}$ cm$^{-3}$ as long as the impurity concentration is less than that of the nCELb 4 and that of the p body region 6. The thickness of the nCELu 5 may be at least 0.9 μm and at most 6.2 μm. This thickness of the nCELu 5 includes that of the p body region 6 formed in a surface layer of the nCELu 5.

The p body region (first semiconductor region) 6 is selectively formed in the surface layer of the nCELu 5. Multiple p body regions 6 are formed part from each other in the surface layer of the nCELu 5 which is not shown in FIG. 1. The impurity concentration of the p body region 6 is higher than that of the n$^-$ drift layer 3, that of the nCELb 4, and that of the nCELu 5. For example, the p body region 6 may have $1\times10^{18}$ cm$^{-3}$ of impurity concentration and 0.6 μm of thickness. The nCELu 5 flanked by the p body regions 6 on both sides may have 5 μm of width in the direction the p body regions 6 are arranged in parallel (hereinafter, horizontal direction).

The p body region 6 is a diffusion layer formed by ion implantation of aluminum (Al). The p body region 6 is formed in the surface layer of the nCELu 5 with 0.3 μm depth and thus the thickness of part of the nCELu 5 where the nCELu 5 is sandwiched by the nCELb 4 and the p body region 6 is for example at least 0.3 μm and at most 2.6 μm.

In this embodiment, the impurity concentration of the nCELu 5 is $2\times10^{16}$ cm$^{-3}$, the thickness of part of the nCELu 5 sandwiched by the nCELb 4 and the p body region 6 is 0.3 μm, the impurity concentration of the nCELb 4 is $8\times10^{16}$ cm$^{-3}$, and the thickness of the nCELb 4 is 0.3 μm. The diffusion of impurity in a SiC semiconductor in the direction perpendicular to the vertical direction is less than that in the silicon semiconductor and thus a semiconductor layer in FIG. 1 is illustrated in rectangular form (semiconductor layers of IGBTs in FIG. 2 to FIG. 5 are also written in rectangular form).

A p$^-$ low density channel region 7 and an n$^{++}$ emitter region (second semiconductor region) 8 are selectively formed in a surface layer of the p body region 6. The p$^-$ low density channel region 7 and the n$^{++}$ emitter region 8 are semiconductor layers formed by ion injection. The p$^-$ low density channel region 7 is disposed on one end of the p body region 6 and contacts the nCELu 5. The n$^{++}$ emitter region 8 contacts the side of the p$^-$ low density channel region 7 opposite to the side contacting the nCELu 5.

The side of the n$^{++}$ emitter region 8 that does not contact the p$^-$ low density channel region 7 is terminated by the p body region 6. The arrangement of the p$^-$ low density channel region 7 and the n$^{++}$ emitter region 8 in each p body region 6 are symmetrical to that of another p$^-$ low density channel region 7 and another n$^{++}$ emitter region 8 in another adjacent p body region 6, which is not illustrated in figures.

The impurity concentration of the p$^-$ low density channel region 7 is lower than that of the p body region 6. For example, the p$^-$ low density channel region 7 has $8\times10^{16}$ cm$^{-3}$ of impurity concentration and 0.3 μm of thickness. The impurity concentration of the n$^{++}$ emitter region 8 is higher than that of the n$^-$ drift layer 3, that of the nCELb 4, and that of the nCELu 5. For example, the n$^{++}$ emitter region 8 has $5\times10^{19}$ cm$^{-3}$ of impurity concentration and 0.3 μm of thickness.

The p$^-$ low density channel region 7 and the n$^{++}$ emitter region 8 are formed in a surface layer of the p body region 6 by ion injection. The p$^-$ low density channel region 7 and the n$^{++}$ emitter region 8 are formed with the depth of 0.3 μm and thus part of the p body region 6 where the p body region 6 is sandwiched by the nCELu 5 and the p$^-$ low density channel region 7 and the n$^{++}$ emitter region 8 is for example 0.3 μm.

The width of the p$^-$ low density channel region 7 in the horizontal direction may be 0.75 μm. The width of the n$^{++}$ emitter region 8 in the horizontal direction may be 3 μm. The horizontal width of the surface layer of the p body region 6 where the p$^-$ low density channel region 7 or the n$^{++}$ emitter region 8 is not disposed may be 1 μm.

A gate electrode (control electrode) 10 is disposed above the p$^-$ low density channel region 7 with a gate insulating film 9 therebetween. An emitter electrode (input electrode) 12 contacts the n$^{++}$ emitter region 8 and the p body region 6 with a p$^{++}$ contact layer therebetween. The p$^{++}$ contact layer may be omitted if the impurity concentration in the surface layer of the p body region 6 is sufficiently high. The emitter electrode 12 is insulated from the gate electrode 10 by an interlayer insulating film 11. The p$^+$ collector layer 1 contacts a collector electrode (output electrode) 13 on the other side, the side opposite to one contacting the n$^{++}$ buffer layer 2 (front side).

A manufacturing method of the IGBT 100 of FIG. 1 will be explained. The n$^-$ drift layer 3 of the 170 μm thickness is epitaxially grown on an off-angle n$^+$ SiC substrate having 300 μm of thickness. The n$^{++}$ buffer layer 2 with 2 μm thickness and the p$^+$ collector layer 1 with 20 μm thickness are epitaxially grown in this order. Further, a protective film (not shown) that protects the p$^+$ collector layer 1 when the n$^+$ SiC substrate is polished is formed on the p$^+$ collector layer 1. The n$^+$ SiC substrate is completely removed by the polishing and the thickness of the n$^-$ drift layer 3 is reduced to 150 μm thickness, removing about 20 μm by the polishing.

The nCELb 4 is epitaxially grown on the n$^-$ drift layer 3 with nitrogen, for example, doped as impurity. It suffices to form the nCELb 4 only in the active region. By this reason, the nCELb 4 may be formed only in the surface layer of the n$^-$ drift layer 3 in the active region by ion injection.

When the nCELb 4 is formed by ion injection, a resist mask is formed on the n$^-$ drift layer 3. The resist mask has an opening that exposes an area where the nCELb 4 is formed. Nitrogen ions, for example, are injected in the n$^-$ drift layer 3 exposed through the opening of the resist mask. In this way, the nCELb 4 is formed in the surface layer of the n$^-$ drift layer 3 over the active region. After the injection, the resist mask is removed.

After the formation of the nCELb 4, the nCELu 5 is epitaxially grown on the nCELb 4 with nitrogen, for example, doped as impurity. A resist mask is formed on the nCELu 5. The resist mask has an opening that exposes an area where the p body region 6 is formed. Through the opening of the resist mask, p type impurity ions are injected into the nCELu 5. It is preferable to introduce ions such that the impurity concentration in the shallow part of the p body region is lower than that of the deeper part of the p body region because in the subsequent step, the p$^-$ low density channel region 7 that has a lower impurity concentration than the p body region 6 is formed in the surface layer of the p body region 6.

An annealing process follows. By the annealing process, the p body region 6 is selectively formed in the surface layer of the nCELu 5. The resist mask used for the formation of the p body region 6 is removed. A resist mask is formed on the p body region 6. The resist mask has an opening that exposes an area where the p$^{++}$ contact layer is formed. Impurity ions are injected into the p body region 6 through the opening of the resist mask. Further, a resist mask with an opening that exposes an area where the p$^-$ low density channel region 7 is formed is built. Impurity ions are injected into the p body region 6 through the opening of the resist mask.

When the impurity concentration in the surface layer of the p body region 6 is lower than a desired impurity concentration in the p⁻ low density channel region 7, p type impurity is injected so that the p⁻ low density channel region 7 has a desired impurity concentration. When the impurity concentration in the surface layer of the p body region 6 is higher than a desired impurity concentration in the p⁻ low density channel region 7, n type impurity is injected so that p⁻ low density channel region 7 has a desired impurity concentration.

An annealing process follows. By the annealing process, the p⁻ low density channel region 7 is selectively formed in the surface layer of the p body region 6. The resist mask used for the formation of the p⁻ low density channel region 7 is removed. A resist mask is formed on the p⁻ low density channel region 7. The resist mask has an opening that exposes an area where the n⁺⁺ emitter region 8 is formed. Through the opening of the resist mask, n type impurity ions are injected into the p body region 6.

An annealing process follows. By the annealing process, the n⁺⁺ emitter region 8 is selectively formed in the surface layer of the p body region 6. The resist mask used for the formation of the n⁺⁺ emitter region 8 is removed. The gate electrode 10 of polycrystalline silicon is formed above the p⁻ low density channel region 7 with the gate insulating film 9 therebetween. The interlayer insulating film 11 is formed and covers the gate electrode 10.

A photolithography process selectively removes the interlayer insulating film 11 and the gate insulating film 9. A contact hole is formed that connects the p body region 6 and the n⁺⁺ emitter region 8 with the emitter electrode 12. The emitter electrode 12 is formed that connects to the p⁺⁺ contact layer (p body region 6 when the p⁺⁺ contact layer has not been formed) and the n⁺⁺ emitter region 8 via the contact hole. A protective film (not shown) that covers the emitter 12 is formed. The collector electrode 13 that contacts the p⁺ collector layer 1 is formed and the IGBT 100 of FIG. 1 is complete.

According to the first embodiment, two n type semiconductor layers (nCELb 4 and nCELu 5) are formed between the n⁻ drift layer 3 and the p body region 6. Of the two n type semiconductor layers, the n⁺ semiconductor layer (nCELb 4) placed toward the n⁻ drift layer 3 has a higher impurity concentration than the n⁻ drift layer 3. Thus, under the forward biasing, holes injected from the p⁺ collector layer 1 to the n⁻ drift layer 3 have difficulty to go to the emitter electrode 12 and are stored in the n⁻ drift layer 3 near the interface between the n⁻ drift layer 3 and the nCELb 4 (carrier storage effect). The collector-emitter current density $J_{ce}$ can be increased by the carrier storage density. As a result, the internal loss in the IGBT 100 is reduced.

Further, the intensity of electric field near the pn junction of the p body region 6 and the nCELu 5 that is reverse biased under the forward biasing is reduced (field concentration reduction effect) since the impurity concentration of the nCELu 5 that contacts the p body region 6 is lower than that of the nCELb 4. As a result, an excessive electric field concentration on the nCELb 4 can be avoided. Therefore, reduction of the breakdown voltage of the IGBT 100 can be prevented.

As explained above, the semiconductor device of the first embodiment has two CELs compared to the conventional one-CEL structure. Of the two CELs, a CELb is formed mainly aiming to obtain the carrier storage effect and has a higher impurity concentration than before. As a result, breakdown voltage reduction is prevented and the collector-emitter current density $J_{ce}$ is increased. Furthermore, a CELu is formed mainly aiming to reduce the intensity of electric field and has a lower impurity concentration than before. As a result, breakdown voltage can be increased without being restricted by the carrier storage effect. Thus, the trade-off relation between the collector-emitter current density $J_{ce}$ and the breakdown voltage is improved.

When the n⁺⁺ buffer layer 2 is epitaxially formed and the n⁻ drift layer 3 is epitaxially formed on the n⁺ SiC substrate, a basal plane dislocation in the n⁺ SiC substrate propagates into the n⁻ drift layer 3. When the n⁺ SiC substrate and 20 μm of the n⁻ drift layer 3 are polished away and the nCELb 4 and the nCELu 5 are epitaxially formed, the basal plane dislocation in the n⁻ drift layer 3 propagates into the nCELb 4 and the nCELu 5.

Since the nCELu 5 has a lower impurity concentration than the nCELb 4, the basal plane dislocation in the nCELb 4 hardly propagates into the nCELu 5 during the epitaxial growth of the nCELu 5. This is because a growth layer with a lower impurity concentration under the epitaxial growth more prevents the propagation of the basal plane dislocation. As a result, the stacking fault formed due to the basal plane dislocation under the forward biasing is prevented from occurring in the nCELu 5. Therefore, degradation in the forward direction due to the stacking fault is prevented. Furthermore, since the stacking fault in the nCELu 5 is prevented, the reliability is improved by preventing degradation in the forward direction that could be promoted by the concentration of holes (minor carrier) at the corner of the p body region 6 in the nCELu 5 when the IGBT 100 is switched on or off under the forward biasing.

The stacking fault gathers electrons nearby and the electron condensed stacking fault easily becomes a path of leak current. The semiconductor device according to the first embodiment prevents the stacking fault with the nCELu 5 having a low impurity concentration, resulting in the reduction of the stacking fault across the junction of the nCELu 5 and the p body layer 6. Therefore, leak current due to the stacking fault under high voltage application is reduced and the reduction of the breakdown voltage is prevented.

The characteristics of the IGBT 100 made by the above method will be explained. The IGBT 100 is die-bonded to the lead frame of a TO-type high voltage endurance package. Multiple connecting Al wires are wire-bonded on the emitter electrode 12. Protective high heat resistant resin (nanotechnology resin) covers a chip and the Al wires. In this way, a semiconductor device is fabricated and an operation test has been performed.

The forward biasing between the emitter electrode 12 and the collector electrode 13 without the application of the gate voltage allows for leak current but exhibits favorable forward blocking characteristics. Avalanche breakdown, breakdown voltage at room temperature, has been around 18.5 kV. Leak current before the avalanche breakdown at room temperature has been at most $3 \times 10^{-3}$ A/cm² and even at higher temperature of 250° C. has been at most $4 \times 10^{-2}$ A/cm².

When gate voltage greater than or equal to a threshold voltage is applied to the gate electrode 10 and the forward applied voltage is applied between the collector and the emitter, on-current flows at about 2.7 V or more of built-in voltage. The collector-emitter current density $J_{ce}$ has favorably been 210 A/cm² under 5 V of collector-emitter voltage (hereinafter, $V_{ce}$).

For comparison, an nSiC-IGBT that has an undivided CEL is prepared. The impurity concentration of the CEL is set to $6 \times 10^{16}$ cm⁻³ which is the average of the nCELu 5 and the nCELb 4. The thickness of the CEL is set to 0.6 μm which is the sum of the thickness of the nCELu 5 and the nCELb 4. The other structural features of the nSiC-IGBT are approximately identical to those of the present embodiment. This nSiC-IGBT has about 17.4 kV of breakdown voltage and 160 A/cm² of collector-emitter current density $J_{ce}$ at 5 V.

In the present embodiment, turn-on time is 370 ns and turn-off time is 920 ns, realizing a high speed operation. Even after a 500-hour energization test, the collector-emitter current density $J_{ce}$ has been 100 A/cm² and the increase of on-voltage has been at most 0.15 V. Therefore, no significant decrease in reliability has been recognized. Some IGBT with a conventional structure of an undivided CEL has shown a 0.37 V or more increase in the identical energization test.

As explained above, the semiconductor device according to the first embodiment improves the collector-emitter current density $J_{ce}$ without degrading the breakdown voltage and can present a highly reliable IGBT 100.

Figure 2:
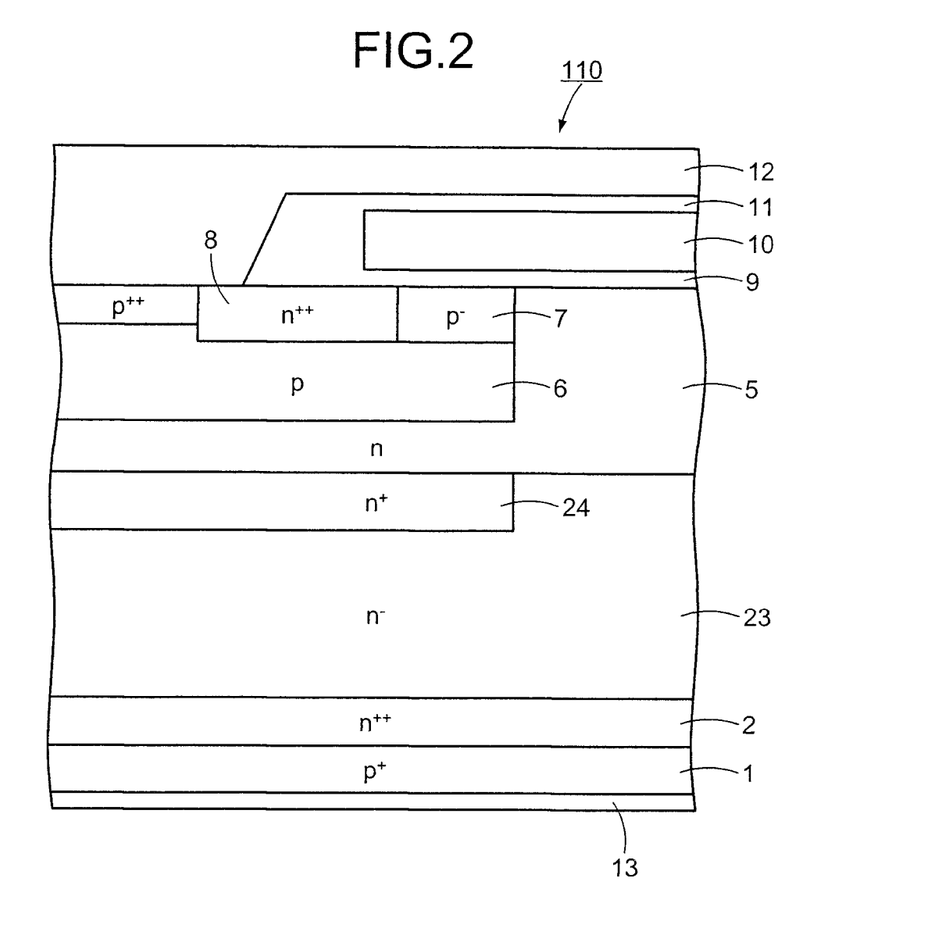
FIG. 2 is a cross sectional view of a semiconductor device according to the second embodiment.

FIG. 2 is a cross sectional view of a semiconductor device according to the second embodiment. The semiconductor device according to the second embodiment is an IGBT 110 made up of SiC semiconductor and having a 10 kV class breakdown voltage and a planar gate structure. The IGBT 110 is different from the IGBT 100 in that a nCELb 24 is disposed under the p body region 6 with the nCELu 5 therebetween.

Further, the IGBT 110 is a field stop IGBT (FS-IGBT). The FS-IGBT is configured such that two functions of a buffer layer, i.e., a field stop function of stopping the extension of a depletion layer and a function of suppressing the carrier injection from a collector layer, are divided to leave only the field stop function in the buffer layer. The function of suppressing the carrier injection is achieved by making the impurity concentration of the p collector layer considerably lower.

By lowering the impurity concentration in the p collector layer to suppress the injection of carriers, a carrier lifetime control becomes unnecessary that is normally sued for suppressing a problem caused by the excessive injection of carriers from the p collector layer. The problem caused by the excessive injection of carriers is a significant increase in a turn-off loss because a turn-off time is elongated due to excessive carriers remaining at the time of turn-off of the IGBT.

As depicted in FIG. 2, the nCELb 24 is selectively formed in a surface layer of an n⁻ drift layer 23. The nCELb 24 is a diffusion layer formed by, for example, ion implantation. The impurity concentration and the thickness of the n⁻ drift layer 23 may be $3\times10^{14}$ cm⁻³ and 100 μm. The nCELu 5 is formed on the n⁻ drift layer 23 and the nCELb 24. The impurity concentration and the thickness of the nCELu 5 may be $2\times10^{16}$ cm⁻³ and 0.3 μm. The impurity concentration and the thickness of the nCELb 24 may be $8\times10^{16}$ cm⁻³ and 0.3 μm.

The p body region 6 is selectively formed in a surface layer of the nCELu 5 and at a position facing the nCELb 24. The p body region 6 is formed above the nCELb 24 with the nCELu 5 therebetween. The width of the nCELb 24 in the horizontal direction is approximately identical to that of the p body region 6.

The impurity concentration and the thickness of the n buffer layer may be $4.2\times10^{17}$ cm⁻³ and 3.0 μm. The impurity concentration and the thickness of the p collector layer may be $1.1\times10^{18}$ cm⁻³ and 20 μm. The surface of the p collector layer on the collector electrode's side is a high concentration p⁺⁺ contact layer in order to reduce the contact resistance between the p collector layer and the collector electrode. The impurity concentration of the p⁺⁺ contact layer may be $5\times10^{19}$ cm⁻³. The p⁺⁺ contact layer may be omitted if the impurity concentration in the surface layer of the p body region 6 is sufficiently high.

The properties of the IGBT 110 except the arrangement and the horizontal width of the nCELb 24, the impurity concentration and the thickness of the n⁻ drift layer 23, the impurity concentration and the thickness of the n buffer layer, and the impurity concentration of the p collector layer are identical to those of the IGBT 100 in the first embodiment. The n buffer layer and the p collector layer in the IGBT 110 are identical to the n⁺⁺ buffer layer and the p⁺ collector layer of the IGBT 100 except the impurity concentration. Thus, the IGBT 110 is explained by deeming the p collector layer as the p⁺ collector layer 1, and the n buffer layer as the n⁺⁺ buffer layer 2.

A manufacturing method of the IGBT 110 of FIG. 2 will be explained. The n⁻ drift layer 23 of the 120 μm thickness is epitaxially grown on an off-angle n⁺ SiC substrate having 300 μm of thickness. The n⁺⁺ buffer layer 2 with 3 μm thickness and the p⁺ collector layer 1 with 20 μm thickness are epitaxially grown in this order. Further, a protective film (not shown) that protects the p⁺ collector layer 1 when the n⁺ SiC substrate is polished is formed on the p⁺ collector layer 1. The n⁺ SiC substrate is completely removed by the polishing and the thickness of the n⁻ drift layer 23 is reduced to 100 μm thickness, removing about 20 μm by the polishing.

A resist mask is formed on the n⁻ drift layer 23. The resist mask has an opening that exposes an area where the nCELb 24 is formed. Nitrogen ion, for example, is implanted in the n⁻ drift layer 23 exposed through the opening of the resist mask.

An annealing process follows. By the annealing process, the nCELb 24 is selectively formed in the surface layer of the n⁻ drift layer 23. The resist mask used for the formation of the nCELb 24 is removed. The nCELu 5 is grown epitaxially on the n⁻ drift layer 23 and the nCELb 24 with nitrogen ions doped as impurity.

A resist mask is formed on the nCELu 5. The resist mask has an opening that exposes an area where the p body region 6 is formed. The opening of the resist mask exposes an area of nCELu 5 above the nCELb 24. Ions are implanted and the annealing process is performed as in the first embodiment. In this way, the p body region 6 is formed in the surface layer of the nCELu 5, the area corresponding to the nCELb 24.

The resist mask used for the formation of the p body region 6 is removed. The processes as in the first embodiment follow, forming the p⁻ low density channel region 7, the n⁺⁺ emitter region 8, the gate insulating film 9, the gate electrode 10, interlayer insulating film 11, the emitter electrode 12, and the collector electrode 13. In this way the IGBT 110 is built.

The semiconductor device according to the second embodiment bestows the effects like the first embodiment. The concentration of electric field around a corner of the p body region 6 is prevented in comparison with the first embodiment because the nCELb 24 is formed under the p body region 6, and the electric field under the application of high voltage pervades within the n⁻ drift layer 23 of lower concentration. As a result, the breakdown voltage increases in comparison with the first embodiment. The carrier storage effect of the nCELb 24 slightly reduces in comparison with the first embodiment since the nCELb 24 is present only under the p body region 6. However, the nCELb 24 under the p body 6 greatly increases the collector-emitter current density $J_{ce}$ in comparison with the conventional structure having one CEL whose impurity concentration is the same.

The characteristics of the IGBT 110 will be explained. The IGBT 110 is die-bonded to the lead frame of a TO-type high voltage endurance package. Multiple connecting Al wires are wire-bonded on the emitter electrode 12. Protective high heat resistant resin (nanotechnology resin) covers a chip and the Al wires. In this way, a semiconductor device is fabricated and operation test has been formed.

The forward biasing between the emitter electrode 12 and the collector electrode 13 without the application of the gate voltage allows for leak current but exhibits favorable forward blocking characteristics. Avalanche breakdown, breakdown voltage at room temperature, has been about 13.4 kV. Leak current before the avalanche breakdown at room temperature is at most $1\times10^{-3}$ A/cm$^2$ and even at higher temperature of 250° C. is favorably at most $2\times10^{-2}$ A/cm$^2$.

When gate voltage greater than or equal to a threshold voltage is applied to the gate electrode 10, and the forward voltage is applied between the collector and the emitter, on-current flows at about 2.7 V or more of built-in voltage. The collector-emitter current density $J_{ce}$ has favorably been 182 A/cm$^2$ under 5 V of collector-emitter voltage (hereinafter, $V_{ce}$). The IGBT where the nCELb 24 is set as the first embodiment has properties of 12.3 kV of breakdown voltage and 195 A/cm$^2$ of the collector-emitter current density $J_{ce}$.

For comparison, an nSiC-IGBT that has an undivided CEL whose impurity concentration is $8\times10^{16}$ cm$^{-3}$ and thickness is 0.6 μm is prepared. The other structural features of the nSiC-IGBT are approximately identical to those of the present embodiment. This nSiC-IGBT has about 10.1 kV of breakdown voltage and about 180 A/cm$^2$ of collector-emitter current density $J_{ce}$ at 5 V.

In the present embodiment, turn-on time is 310 ns and turn-off time is 630 ns, realizing a high speed operation. Even after a 500-hour energization test, the collector emitter current density $J_{ce}$ has been 100 A/cm$^2$ and the increase of on-voltage has been at most 0.15 V. Therefore, no significant decrease in reliability has been recognized. Some IGBT with a conventional structure of an undivided CEL has shown a 0.3 V or more increase in the identical energization test.

As explained above, the semiconductor device according to the second embodiment improves the breakdown voltage and reduces turn-off loss without suppressing too much the collector-emitter current density $J_{ce}$ and can present a highly reliable IGBT 110.

A semiconductor device according to the third embodiment is a p type IGBT 150 made up of SiC semiconductor and having a 10 kV class breakdown voltage and a planar gate structure. The IGBT 150 is different from the n type IGBT 100 of the first embodiment in that each semiconductor layer or region has an opposite polarity.

The IGBT 150 will be explained with reference to FIG. 1 and the reference numerals thereof but the polarity is reversed. A pCELb 4 is selectively formed in a surface layer of a p$^-$ drift layer 3. The pCELb 4 is a diffusion layer formed by, for example, ion implantation. The impurity concentration and the thickness of the p$^-$ drift layer 3 may be $3\times10^{14}$ cm$^{-3}$ and 100 μm. The pCELu 5 is formed on the p$^-$ drift layer 3 and the pCELb 4.

The p body region 6 is selectively formed in a surface layer of the pCELu 5. Structural features of the IGBT 150 of the third embodiment are approximately identical to the n IGBT 100 of the first embodiment except the polarity of semiconductor layers and regions.

A manufacturing method of the p IGBT 150 will be explained. The p$^{++}$ buffer layer 2 and the p$^-$ drift layer 3 are epitaxially grown in this order on the front side of the n type SiC substrate, the n$^+$ collector layer 1. The pCELb 4 and the pCELu 5 are epitaxially grown on the p$^-$ drift layer 3.

A resist mask is formed on the pCELu 5. The resist mask has an opening that exposes an area where the n body region 6 is formed. The opening exposes an area of the pCELu 5 above the pCELb 4. The ion implantation and the annealing process are performed as in the first embodiment. In this way, the n body region 6 is formed in the surface layer of the pCELu 5.

The resist mask used for the formation of the n body region 6 is removed. The subsequent processes are performed as in the first embodiment, forming the n$^-$ low density channel region 7, the p$^{++}$ emitter region 8, the gate insulating film 9, the gate electrode 10, the interlayer insulating film 11, the emitter electrode 12, and the collector electrode 13. In this way, the p type IGBT 150 is built.

As explained above, the semiconductor device according to the third embodiment where the p type SiC-IGBT has the opposite polarity brings out the effects like the semiconductor device of the first embodiment. The breakdown voltage is improved and the turn-off loss is reduced without suppressing too much the collector-emitter current density $J_{ce}$, presenting a highly reliable p IGBT 150.

Figure 3:
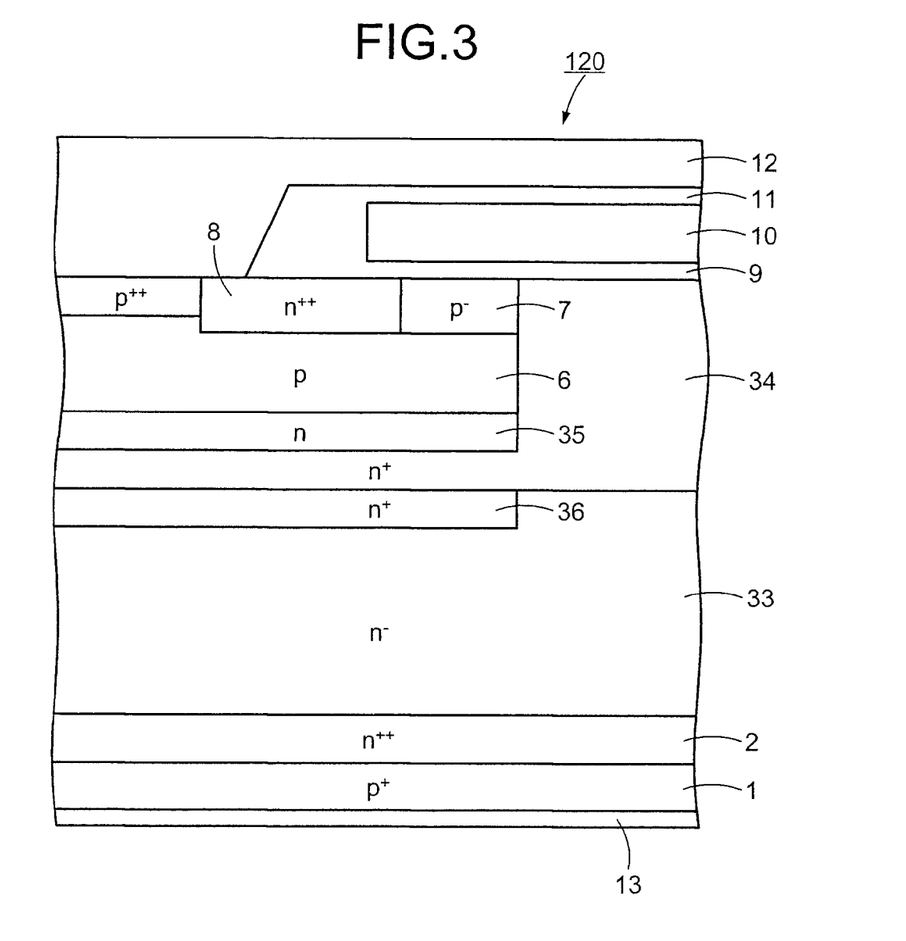
FIG. 3 is a cross sectional view depicting a semiconductor device according to the fourth embodiment.

FIG. 3 is a cross sectional view depicting a semiconductor device according to the fourth embodiment. The semiconductor device is an IGBT 120 made up of SiC semiconductor and having a 18 kV class breakdown voltage and a planar gate structure. The IGBT 120 is different from the IGBT 100 of the first embodiment in two points. Firstly, an nCELu 35 is formed not in the active region but only under the p body region 6. Secondly, in addition to an nCELb (hereinafter "first nCELb") 34 and an nCELu 35, an n$^+$ semiconductor layer (CEL, fourth semiconductor layer, hereinafter "second nCELb") 36 is formed between the p body region 6 and an n$^-$ drift layer 33.

As depicted in FIG. 3, the second nCELb 36 is selectively formed in a surface layer of the n$^-$ drift layer 33. The second nCELb 36 may be a semiconductor layer formed by ion implantation. The impurity concentration of the second nCELb 36 is higher than that of the n$^-$ drift layer 33. The impurity concentration and the thickness of the n$^-$ drift layer 33 may be $2\times10^{14}$ cm$^{-3}$ and 180 μm.

The first nCELb 34 is formed on the n$^-$ drift layer 33 and the second nCELb 36. The first nCELb 34 is a SiC epitaxial layer epitaxially grown with nitrogen (N) doped as impurity. The impurity concentration of the first nCELb 34 is higher than that of the n$^-$ drift layer 33 and lower than that of the second nCELb 36.

The nCELu 35 is selectively formed in a surface layer of the first nCELb 34 and above the second nCELb 36. The nCELu 35 is formed above the second nCELb 36 with the first nCELb 34 therebetween. The nCELu 35 may be a semiconductor layer formed by ion implantation. The p body region 6 is formed over the nCELu 35. The second nCELb 36 is formed only under the p body region 6 with the nCELu 35 and the first nCELb 34 therebetween.

The width of the second nCELb 36 in the horizontal direction is approximately equal to that of the nCELu 35 and the p body region 6. The thickness of part of the first nCELb 34 sandwiched by the nCELu 35 and the second nCELb 36 may be 0.3 μm or more and 5.6 μm or less. Exclusive of the arrangement and the horizontal width of the nCELu 35, the impurity concentration and the thickness of the n$^-$ drift layer 33, and the second nCELb 36, the structure of the IGBT 120 is approximately identical to that of the IGBT 100 of the first embodiment. The impurity concentration and the thickness of the nCELu 35 are $8\times10^{15}$ cm$^{-3}$ and 0.3 μm. The impurity concentration of the first nCELb 34 is $2\times10^{16}$ cm$^{-3}$. The impurity concentration and the thickness of the second nCELb 36 are $8\times10^{16}$ cm$^{-3}$ and 0.3 μm.

A manufacturing method of the IGBT 120 of FIG. 3 will be explained. The n$^-$ drift layer 33 of the 200 μm thickness is epitaxially grown on an off-angle n$^+$ SiC substrate having 300 μm of thickness. The n$^{++}$ buffer layer 2 with 2 μm thickness and the p$^+$ collector layer 1 with 20 μm thickness are epitaxially grown in this order. Further, a protective film (not shown)

that protects the p+ collector layer 1 when the n+ SiC substrate is polished is formed on the p+ collector layer 1. The n+ SiC substrate is completely removed by the polishing and the thickness of the n− drift layer 33 is reduced to 180 μm thickness, removing about 20 μm by the polishing.

A resist mask is formed on the n− drift layer 33. The resist mask has an opening that exposes an area where the second nCELb 36 is formed. Nitrogen ions, for example, are implanted in the n− drift layer 33 exposed through the opening of the resist mask. An annealing process follows. In this way, the second nCELb 36 is selectively formed in the surface layer of the n− drift layer 33. The resist mask used for the formation of the second nCELb 36 is removed.

The first nCELb 34 is epitaxially grown on the n− drift layer 33 and the second nCELb 36 with nitrogen doped as impurity. A resist mask is formed on the first nCELb 34. The resist mask has an opening that exposes an area where the nCELb 35 is formed. The opening exposes part of the first nCELb 34 above the second nCELb 36.

Aluminum ions, for example, are implanted in the first nCELb 34 exposed through the opening of the resist mask. An annealing process follows. The aluminum ions implanted are controlled such that the aluminum ions are less than the impurity concentration of the first nCELb 34, the polarity of the first nCELb 34 remains negative after the implantation, and the impurity concentration of the first nCELb 34 becomes a given impurity concentration. In this way, the nCELu 35 is formed in the surface layer of the first nCELb 34 above the second nCELb 36. With the resist mask used for the formation of the nCELu 35, the ion implantation and the annealing process are performed as in the first embodiment, forming the p body region 6 in the surface layer of the nCELu 35.

The p body region 6 is formed over the nCELu 35. The resist mask used for the formation of the nCELu 25 and the p body 6 is removed. The subsequent processes are performed as in the first embodiment, forming the p− low density channel region 7, the n++ emitter region 8, the gate insulating film 9, the gate electrode 10, the interlayer insulating film 11, the emitter electrode 12, and the collector electrode 13. In this way, the IGBT 120 of FIG. 3 is built.

As explained above, the semiconductor device according to the fourth embodiment brings out the effect similar to the semiconductor device of the second embodiment. Further, according to the semiconductor device of the fourth embodiment, the impurity concentration in the nCELu 35 under the p body region 6 is reduced in comparison with the second embodiment without changing the impurity concentration of the first nCELb 34. As a result, the concentration of electric field near a corner of the p body region 6 is more prevented and the breakdown voltage is improved.

Figure 4:
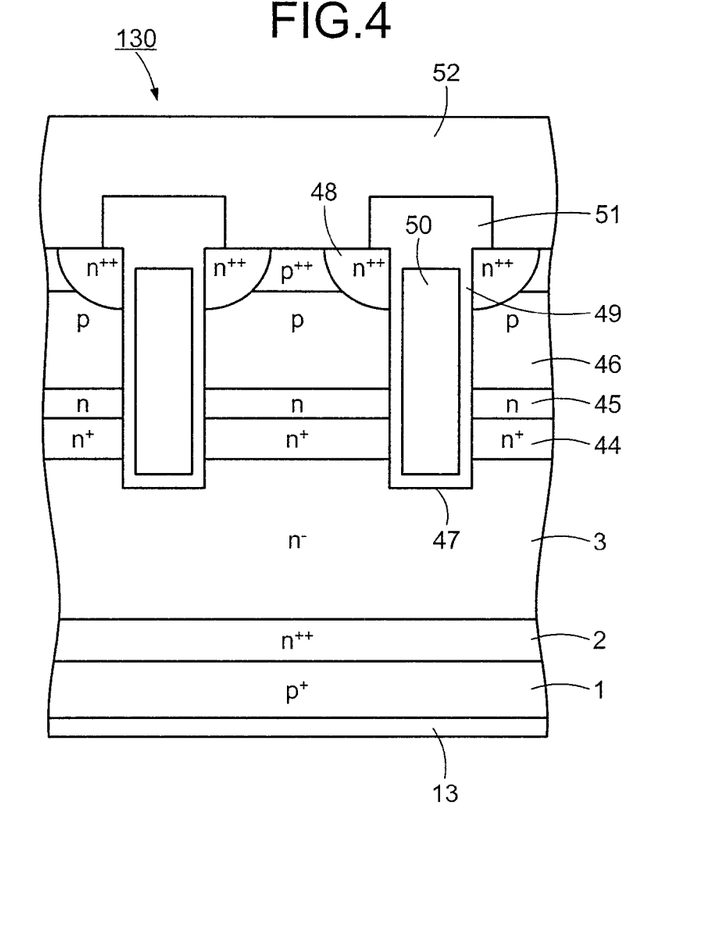
FIG. 4 is a cross sectional view of a semiconductor device according to the fifth embodiment.

FIG. 4 is a cross sectional view of a semiconductor device according to the fifth embodiment. The semiconductor device is an IGBT 130 made up of SiC semiconductor and having an 8 kV class breakdown voltage and a trench gate structure. The IGBT 130 is different from the IGBT 100 of the first embodiment in that the gate of the IGBT 130 takes the trench gate structure instead of the planar gate structure.

As depicted in FIG. 4, an nCELb 44 and an nCELu 45 are stacked in a surface layer of the n− drift layer 3 as in the first embodiment. A p body region 46 is formed over the nCELu 45. The p body region 46 is a SiC epitaxial layer that is epitaxially grown on the nCELu 45. The p body region 46 may be a semiconductor layer formed by ion implantation. When the p body region 46 is an epitaxial layer, the nCELu 45 is an epitaxial layer grown to have a desired thickness for the IGBT 130, at least 0.3 μm and at most 5.6 μm.

A trench 47 is formed on the front side of the semiconductor device. The trench 47 penetrates the p body region 46, the nCELu 45, and the nCELb 44, reaching the n− drift layer 3. A gate insulating film 49 and a gate electrode 50 are embedded in the trench 47. One end (hereinafter, bottom end) of the gate electrode 50 in the trench 47 that is nearer to the p+ collector layer 1 locates in the n− drift layer 3, deeper than the nCELu 45 and the nCELb 44 on the front side of the semiconductor device. A n++ emitter region 48 is selectively formed in a surface layer of the p body region 46 and contacts the gate insulating film 49 deposited on the trench 47.

The IGBT 130 does not include a p− low density channel region. Part of the p body region 46 near the surface that contacts the gate insulating film 49 functions as a channel region. Thus, in order to function as the channel region, the p body region 46 has a relatively low impurity concentration in comparison with the first embodiment and so on and becomes relative thick to save a given channel region. For example, the impurity concentration of the p body region 46 is $3\times10^{16}$ to $8\times10^{17}$ cm$^{-3}$ and the thickness (including the n++ emitter region 48) is set such that the length of the channel region is 0.2 to 4.0 μm. However, the impurity concentration and the thickness of the p body region 46 satisfy a condition that a depletion layer extending from the junction between the p body region 46 and the nCELu 45 does not reach the n++ emitter region 48 under the application of the forward voltage corresponding to the breakdown voltage.

An emitter electrode 52 contacts the p body region 46 and the n++ emitter region 48. The emitter electrode 52 is insulated from the gate electrode 50 by the interlayer insulating film 51. The impurity concentration and the thickness of each region in the IGBT 130 are approximately equal to those of the IGBT 100.

A manufacturing method of the IGBT 130 of FIG. 4 will be explained. The n− drift layer 3 of 100 μm thickness is epitaxially grown on an off-angle n+ SiC substrate having 300 μm of thickness. The n++ buffer layer 2 with 2 μm thickness and the p+ collector layer 1 with 20 μm thickness are epitaxially grown in this order. Further, a protective film (not shown) that protects the p+ collector layer 1 when the n+ SiC substrate is polished is formed on the p+ collector layer 1.

The n+ SiC substrate is completely removed by the polishing and the thickness of the n− drift layer 3 is reduced to 80 μm thickness, removing about 20 μm by the polishing. The nCELb 44, the nCELu 45, and the p body region 46 are grown. A resist mask is formed on the p body region 46. The resist mask has an opening that exposes an area where the trench 47 is formed.

The exposed area is etched and the trench 47 is formed that goes through the p body region 46, the nCELu 45, and the nCELb 44, reaching the n− drift layer 3. The resist mask used for the formation of the trench 47 is removed. The gate insulating film 49 is formed on the surface of the p body region 46 and the side and the bottom of the trench 47 by the heat oxidation treatment. The gate electrode 50 made of, for example, poly-silicone is embedded in the trench 47, on the gate insulating film 49.

The gate electrode 50 is etched back and the gate electrode 50 on the p body region 46 is removed until the gate insulating film 49 on the p body region 46 appears. A resist mask is formed on the gate insulating film 49 and the gate electrode 50. The resist mask has an opening that exposes an area where the n++ emitter layer 48. Through the gate insulating film 49 exposed at the opening of the resist mask, n impurity ions are implanted in the p body region 46.

An annealing process follows. In this way, the n++ emitter layer 48 is selectively formed in the surface layer of the p body region 46. The resist mask used for the formation of the n++ emitter layer 48 is removed. The gate electrode 50 is covered by the interlayer insulating film 51.

The interlayer insulating film 51 and the gate insulating film 49 are selectively removed in the photolithography process. A contact hole is formed in order to connect the p body region 46 and the n++ emitter layer 48 with the emitter electrode 52. The emitter electrode 52 is formed that connects to the p++ contact layer (the p body region if the p++ contact layer has not been formed) and the n++ emitter layer 48 via the contact hole. The subsequent processes as in the first embodiments are performed, forming the collector electrode 13, and the IGBT 130 of FIG. 4 is built.

As explained above, the semiconductor device according to the fifth embodiment alleviates the concentration of electric field at the junction of the p body region 46 and the nCELu 45 by forming the low concentration nCELu 45. By forming the high concentration nCELb 44, the semiconductor device can store holes injected from the p+ collector layer 1 into the n− drift layer 3 near the junction of the n− drift layer 3 and the nCELb 44 in the n− drift layer 3. As a result, the trade-off relation between the collector-emitter current density $J_{ce}$ and the breakdown voltage can be improved as the planar gate structure of the first embodiment.

Furthermore, since the nCELb 44 is formed at the shallower place than the bottom of the trench 47 on the front side of the semiconductor device, the n impurity concentration at a corner of the bottom of the trench 47 does not increase. Therefore, the increase of the intensity of electric field at a corner of the bottom of the trench 47 can be prevented.

The breakdown voltage of the trench IGBT is 8.9 kV and the collector-emitter current density $J_{ce}$ when $V_{ce}$ is 5 V is 460 A/cm² with the impurity concentration and the thickness of the nCELu 45 being $8 \times 10^{15}$ cm⁻³ and 0.3 μm and the impurity concentration and the thickness of the nCELb 44 being $5 \times 10^{16}$ cm⁻³ and 0.3 μm.

For comparison, a trench IGBT that has an undivided CEL is prepared. The impurity concentration of the CEL is set to the average of the nCELu 45 and the nCELb 44. The thickness of the CEL is set to the sum of the thickness of the nCELu 45 and the nCELb 44. The trench IGBT with an undivided CEL has 8.1 kV of the breakdown voltage and 330 A/cm² of the collector-emitter current density $J_{ce}$ when $V_{ce}$ is 5 V.

After a 500-hour energization test, the collector-emitter current density $J_{ce}$ has been 100 A/cm² and the increase of on-voltage has been at most 0.15 V. As can be seen, the improvement of the trade-off relation between the collector-emitter current density $J_{ce}$ and the breakdown voltage is apparent.

Figure 5:
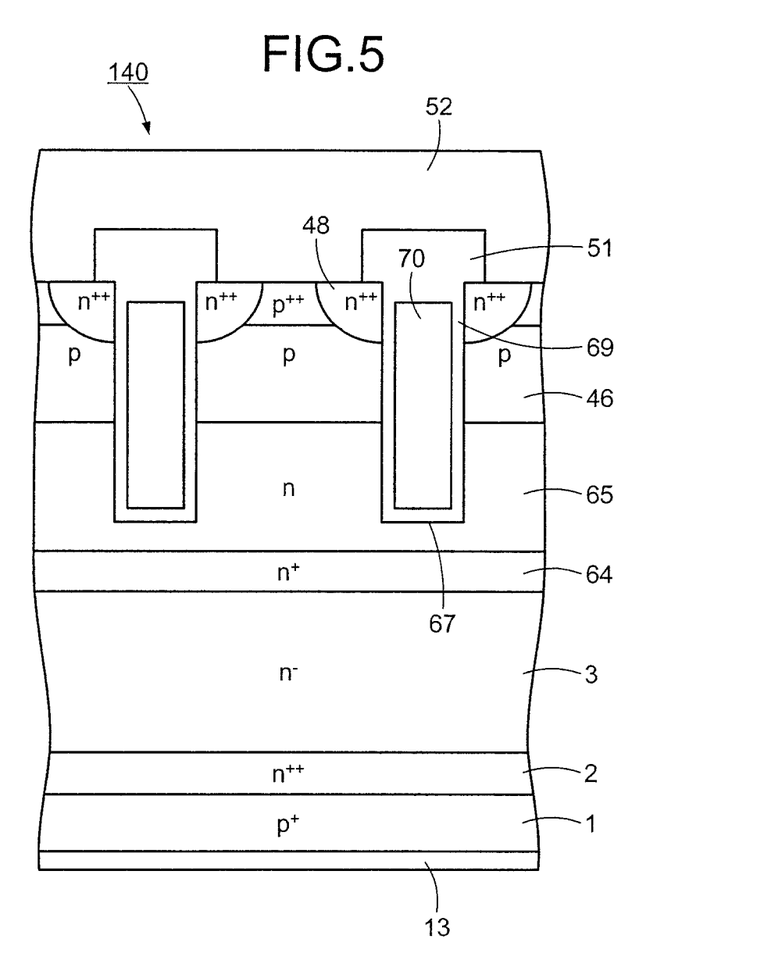
FIG. 5 is a cross sectional view of a semiconductor device according to the sixth embodiment.

FIG. 5 is a cross sectional view of a semiconductor device according to the sixth embodiment. The semiconductor device is an IGBT 140 made up of SiC semiconductor and having a 12 kV class breakdown voltage and a trench gate structure. The IGBT 140 is different from the IGBT 130 of the fifth embodiment in that an nCELb 64 and an nCELu 65 are placed deeper than the bottom of a gate electrode 70 in a trench 67 on the front side of the semiconductor device.

As depicted in FIG. 5, the nCELb 64, the nCELu 65, and the p body region 45 are stacked on the n− drift layer 3 as in the fifth embodiment. The trench 67 penetrates the p body region 46 and reaches the nCELu 65. A gate electrode 70 is embedded in the trench 67, on gate insulating film 69.

The bottom of the gate electrode 70 locates in the nCELu 65 and does not reach the nCELb 64. The n++ emitter region 48 is selectively formed in a surface layer of the p body region 46 and contacts the gate insulating film 69 formed on the side wall of the trench 67. The structure of the IGBT 140 except the nCELb 64, the nCELu 65, and the trench 67 is approximately identical to that of the IGBT 130 of the fifth embodiment.

A manufacturing method of the IGBT 140 of FIG. 5 will be explained. The n− drift layer 3 of 140 μm thickness is epitaxially grown on an off-angle n+ SiC substrate having 300 μm of thickness. The n++ buffer layer 2 with 2 μm thickness and the p+ collector layer 1 with 20 μm thickness are epitaxially grown in this order. Further, a protective film (not shown) that protects the p+ collector layer 1 when the n+ SiC substrate is polished is formed on the p+ collector layer 1. The n+ SiC substrate is completely removed by the polishing and the thickness of the n− drift layer 3 is reduced to 120 μm thickness, removing about 20 μm by the polishing.

The nCELb 64, the nCELu 65, and the p body region 46 are formed. A resist mask is formed on the p body region 46. The resist mask has an opening that exposes an area where the trench 67 is formed. The exposed area is etched and the trench 67 is formed that penetrates the p body region 46 and reaches the nCELu 65. The resist mask used for the formation of the trench 67 is removed. The subsequent processes are performed as in the fourth embodiment, forming the gate insulating film 69, the gate electrode 70, the n++ emitter region 48, the interlayer insulating film 51, the emitter electrode 52, and the collector electrode 13. In this way, the IGBT 140 of FIG. 5 is built.

As explained above, the semiconductor device according to the sixth embodiment brings out the effects like the semiconductor device of the fifth embodiment. According to the semiconductor device according to the sixth embodiment, the nCELb 64 is placed deeper than the bottom of the trench 67 on the front side of the semiconductor device. The trench 67 is arranged so that the bottom of the trench 67 does not locate in the nCELb 64 having a high impurity concentration but locates in the nCELu 65 having a low impurity concentration.

The impurity concentration of the nCELu 65 may be $3 \times 10^{14}$ to $2 \times 10^{16}$ cm⁻³. The impurity concentration of the nCELb 64 depends on the thickness of the nCELb 64 and may be $8 \times 10^{15}$ to $1 \times 10^{17}$ cm⁻³. The impurity concentration of the nCELu 65 is lower than that of the nCELb 64.

The nCELu 65 having a low impurity concentration prevents the increase of the intensity of electric field at a corner of the trench 67 and realizes a high breakdown voltage. The nCELb 64 having a high impurity concentration promotes the carrier storage effect and realizes a high collector-emitter current density $J_{ce}$.

The breakdown voltage of the trench IGBT is 13.3 kV and the collector-emitter current density $J_{ce}$ is 370 A/cm² where the impurity concentration of the nCELu 65 is $8 \times 10^{24}$ cm⁻³ and the impurity concentration and the thickness of the nCELb 64 are $4 \times 10^{26}$ cm⁻³ and 0.3 μm.

For comparison, a trench IGBT that has an undivided CEL is prepared. The impurity concentration of the CEL is set to the average of the nCELu 65 and the nCELb 64. The thickness of the CEL is set to the sum of the thickness of the nCELu 65 and the nCELb 64. This trench IGBT has about 12.2 kV of breakdown voltage and 310 A/cm² of collector-emitter current density $J_{ce}$ when $V_{ce}$ equals to 5 V.

After a 500-hour energization test, the collector-emitter current density $J_{ce}$ has been 100 A/cm² and the increase of on-voltage has been at most 0.15 V. As can be seen, the improvement of the trade-off relation between the collector-emitter current density $J_{ce}$ and the breakdown voltage is apparent.

The embodiments above introduce two or three CELs but are not limited to these examples. Four or more CELs may be formed. In that case, a semiconductor device is designed such that a CEL placed nearer to the p body region has a lower impurity concentration and a CEL placed nearer to the n⁻ drift layer has a higher impurity concentration. Further, an IGBT may be made up of silicon semiconductor instead of SiC semiconductor. Furthermore, a semiconductor device in which the polarity of each semiconductor layer is reversed works as well.

A semiconductor device according to the embodiments is applicable to a power semiconductor device made of SiC semiconductor.

According to the semiconductor device, the increase of the electric field intensity near a corner of the first semiconductor region is prevented since the first semiconductor layer is placed under the first semiconductor region (nearer to the semiconductor layer).

According to the semiconductor device, the increase of the electric field intensity near a corner of the first semiconductor region is prevented since the fourth semiconductor layer is formed under the first semiconductor region (nearer to the semiconductor layer).

According to the semiconductor device, the increase of the electric field intensity around a corner of the bottom of the trench is prevented since the second semiconductor layer is formed at a shallower place than the bottom of the trench on the front side of the semiconductor layer.

According to the semiconductor device, the increase of the electric field intensity around a corner of the bottom of the trench is prevented since the second semiconductor layer is formed at a deeper place than the bottom of the trench on the front side of the semiconductor layer.

According to the semiconductor device, two layers of n semiconductor layer (second semiconductor layer and third semiconductor layer) are formed between the first semiconductor layer and the first semiconductor region. Of the two n semiconductor layers, the second semiconductor layer has a higher impurity concentration than the first semiconductor layer and thus under the forward biasing, holes injected in the first semiconductor layer hardly moves to the input electrode and are stored in the first semiconductor layer near the junction between the first semiconductor layer and the second semiconductor layer (carrier storage effect).

The carrier storage effect increases the collector-emitter current density $J_{ce}$. The third semiconductor layer can acquire a similar carrier storage effect as the second semiconductor layer by arranging that of the two n semiconductor layers between the first semiconductor layer and the first semiconductor region, the impurity concentration of the third semiconductor layer is higher than that of the first semiconductor layer.

Furthermore, since the impurity concentration of the third semiconductor layer adjacent to the first semiconductor region is lower than that of the second semiconductor layer, the electric field intensity near the pn junction between the first semiconductor region and the third semiconductor layer that is reverse biased under the forward biasing is reduced (field concentration reduction effect). As a result, excessive electric field concentration in the second semiconductor layer can be avoided and the second semiconductor layer can have a higher impurity concentration than the first semiconductor layer. In this way, the trade-off relation between the collector-emitter current density $J_{ce}$ and the breakdown voltage can be improved.

Furthermore, according to the semiconductor device, the third semiconductor layer having a lower impurity concentration than the second semiconductor layer prevents a basal plane dislocation that has propagated from the semiconductor layer made of SiC semiconductor to the second semiconductor layer from further propagating to the third semiconductor layer during the epitaxial growth of the third semiconductor layer. As a result, a stacking fault due to the basal plane dislocation under the forward biasing is prevented from appearing in the third semiconductor layer. Degradation over time of the forward characteristics due to the stacking fault is prevented. Further, since the stacking fault in the third semiconductor layer can be prevented, degradation of the forward characteristics is prevented though the degradation can be promoted by the concentration of the minor carrier of holes in the third semiconductor layer around a corner of the first semiconductor region when the semiconductor device is switched on and off under the forward biasing.

Furthermore, according to the semiconductor device, the third semiconductor layer can reduce the concentration of electric filed around a corner of the first semiconductor region under the forward biasing. As a result, the enlargement of stacking fault around a corner of the first semiconductor region can be prevented. Therefore, leak current originated from the stacking fault can be reduced.

According to embodiments, the breakdown voltage and the current density are improved. Further, degradation over time of the collector-emitter current is prevented and the reliability is enhanced.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

The present document incorporates by reference the entire contents of Japanese priority document, 2011-227473 filed in Japan on Oct. 14, 2011.

What is claimed is:

1. A semiconductor device comprising:
a semiconductor layer of a first conductor type;
a first semiconductor layer of a second conductor type, formed on the front side of the semiconductor layer;
a second semiconductor layer of the second conductor type, formed on the first semiconductor layer and having a higher impurity concentration than the first semiconductor layer;
a third semiconductor layer of the second conductor type, formed on the second semiconductor layer and having a lower impurity concentration than the second semiconductor layer;
a first semiconductor region of the first conductor type, selectively formed in a surface layer of the third semiconductor layer;
a second semiconductor region of the second conductor type, selectively formed in a surface layer of the first semiconductor region;
an input electrode that contacts the second semiconductor region;
a control electrode that is disposed above part of the first semiconductor region with an insulating film therebetween, the part being sandwiched by the second semiconductor region and the third semiconductor layer; and
an output electrode that is disposed on the back side of the semiconductor layer.

2. A semiconductor device comprising:
a semiconductor layer of a first conductor type;
a first semiconductor layer of a second conductor type that is formed on the front side of the semiconductor layer;
a second semiconductor layer of the second conductor type that is selectively formed in a surface layer of the first semiconductor layer and has a higher impurity concentration than the first semiconductor layer;

a third semiconductor layer of the second conductor type that is formed on the first semiconductor layer and the second semiconductor layer and has a lower impurity concentration than the second semiconductor layer;

a first semiconductor region of the first conductor type that is formed in a surface layer of the third semiconductor layer that corresponds to the second semiconductor layer;

a second semiconductor region of the second conductor type, selectively formed in a surface layer of the first semiconductor region;

an input electrode that contacts the second semiconductor region;

a control electrode that is disposed above part of the first semiconductor region with an insulating film, the part being sandwiched between the second semiconductor region and the third semiconductor layer; and an output electrode that is disposed on the back side of the semiconductor layer.

3. A semiconductor device comprising:

a semiconductor layer of a first conductor type;

a first semiconductor layer of a second conductor type that is formed on the front side of the semiconductor layer;

a fourth semiconductor layer of the second conductor type that is selectively formed in a surface layer of the first semiconductor layer and has a higher impurity concentration than the first semiconductor layer;

a second semiconductor layer of the second conductor type that is formed on the first semiconductor layer and the fourth semiconductor layer, has a higher impurity concentration than the first semiconductor layer, and has a lower impurity concentration than the fourth semiconductor layer;

a third semiconductor layer of the second conductor type that is formed in a surface layer of the second semiconductor layer corresponding to the position of the fourth semiconductor layer and has a lower impurity concentration than the second semiconductor layer;

a first semiconductor region of the first conductor type that is formed in a surface layer of the third semiconductor layer;

a second semiconductor region of the second conductor type, selectively formed in a surface layer of the first semiconductor region;

an input electrode that contacts the second semiconductor region;

a control electrode that is disposed above part of the first semiconductor region with an insulating film therebetween, the part being sandwiched between the second semiconductor region and the third semiconductor layer; and an output electrode that is disposed on the back side of the semiconductor layer.

4. A semiconductor device comprising:

a semiconductor layer of a first conductor type;

a first semiconductor layer of a second conductor type that is formed on the front side of the semiconductor layer;

a second semiconductor layer of the second conductor type, formed on the first semiconductor layer and having a higher impurity concentration than the first semiconductor layer;

a third semiconductor layer of the second conductor type, formed on the second semiconductor layer and having a lower impurity concentration than the second semiconductor layer;

a first semiconductor region of the first conductor type that is formed in a surface layer of the third semiconductor layer;

a trench that penetrates the first semiconductor region and reaches the third semiconductor layer;

a control electrode embedded in the trench with an insulating film therebetween;

a second semiconductor region of the second type that is selectively formed in a surface layer of the first semiconductor region and contacts the insulating film on a side wall of the trench;

an input electrode that contacts the second semiconductor region; and an output electrode that is disposed on the back side of the semiconductor layer.

5. The semiconductor device according to claim 4, wherein the trench penetrates the first semiconductor region, the third semiconductor layer, and the second semiconductor layer, reaching the first semiconductor layer.

6. The semiconductor device according to claim 1, wherein the third semiconductor layer has a higher impurity concentration than the first semiconductor layer.

7. The semiconductor device according to claim 1, wherein the third semiconductor layer has a lower impurity concentration than the first semiconductor region.

8. The semiconductor device according to claim 1, wherein the second semiconductor layer has a lower impurity concentration than the first semiconductor region.

9. The semiconductor device according to claim 1, wherein the second semiconductor layer has such an impurity concentration and thickness that the second semiconductor layer is depleted by voltage smaller than breakdown voltage of the semiconductor device.

10. The semiconductor device according to claim 1, wherein the semiconductor device is made of semiconductor material that has a wider bandgap than silicon.

11. The semiconductor device according to claim 1, wherein the semiconductor device is an insulated gate bipolar transistor.

\* \* \* \* \*

UNITED STATES PATENT AND TRADEMARK OFFICE
CERTIFICATE OF CORRECTION

PATENT NO. : 8,748,937 B2
APPLICATION NO. : 13/651973
DATED : June 10, 2014
INVENTOR(S) : Yoshitaka Sugawara et al.

It is certified that error appears in the above-identified patent and that said Letters Patent is hereby corrected as shown below:

On the title page item (71)

Change (71) Applicant: Fuji Electric Co., Ltd., Kawasaki (JP)

To be (71) Applicant: FUJI ELECTRIC CO., LTD., Kawasaki-shi, JAPAN
    Yoshitaka Sugawara, Hitachi-shi, JAPAN Signed and Sealed this
Twenty-third Day of September, 2014

Michelle K. Lee
*Deputy Director of the United States Patent and Trademark Office*